United States Patent
Grodzki

(10) Patent No.: US 9,778,339 B2
(45) Date of Patent: Oct. 3, 2017

(54) METHOD AND DEVICE FOR OPTIMIZATION OF A PULSE SEQUENCE FOR A MAGNETIC RESONANCE SYSTEM

(71) Applicant: Siemens Aktiengesellschaft, Munich (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 482 days.

(21) Appl. No.: 14/565,956

(22) Filed: Dec. 10, 2014

(65) Prior Publication Data

US 2015/0160317 A1 Jun. 11, 2015

(30) Foreign Application Priority Data

Dec. 10, 2013 (DE) .................. 10 2013 225 415

(51) Int. Cl.
*G01R 33/54* (2006.01)

(52) U.S. Cl.
CPC ......... *G01R 33/546* (2013.01); *G01R 33/543* (2013.01)

(58) Field of Classification Search
CPC ........................ G01R 33/546; G01R 33/543
See application file for complete search history.

(56) References Cited

U.S. PATENT DOCUMENTS

| 5,512,825 | A | * | 4/1996 | Atalar | G01R 33/4833 |
|---|---|---|---|---|---|
| | | | | | 324/303 |
| 5,758,646 | A | * | 6/1998 | Van Der Meulen | G01R 33/54 |
| | | | | | 324/309 |
| 8,030,920 | B2 | | 10/2011 | Vu et al. | |
| 2013/0200893 | A1 | * | 8/2013 | Heismann | G01R 33/3854 |
| | | | | | 324/314 |
| 2014/0232396 | A1 | * | 8/2014 | Grodzki | G01R 33/543 |
| | | | | | 324/309 |
| 2015/0032406 | A1 | * | 1/2015 | Grodzki | G01R 33/5608 |
| | | | | | 702/123 |

OTHER PUBLICATIONS

Davids et al; "Optimization of Fast k-space Trajectories for 3D Spatially Selective Parallel Excitations"; Proc. Int. Mag. Reson. Med., ISMRM; (2013) p. 1452.

* cited by examiner

*Primary Examiner* — G. M. Hyder
(74) *Attorney, Agent, or Firm* — Schiff Hardin LLP

(57) ABSTRACT

In a method and a pulse sequence optimization device to determine a pulse sequence for a magnetic resonance system, a determination of a time interval in a pulse sequence that is to be optimized with regard to a gradient curve initially takes place, the pulse sequence including a number of radio-frequency pulses and a number of gradient pulses that are to be chronologically coordinated, under determination of the following boundary conditions for the gradient curve: length of the time interval, target integral of the gradient curve over the time interval, start value of the gradient curve at the beginning of the time interval, end value of the gradient curve at the end of the time interval. A gradient curve is then defined according to a function that is linear per segment by addition of a first linear function that connects the start value and the end value and a second function that is linear per segment that assumes a function value of "zero" at the beginning and end of the time interval, and that is defined so that the sum of the integral of the first linear function and of the integral of the second function corresponds to the target integral.

17 Claims, 9 Drawing Sheets

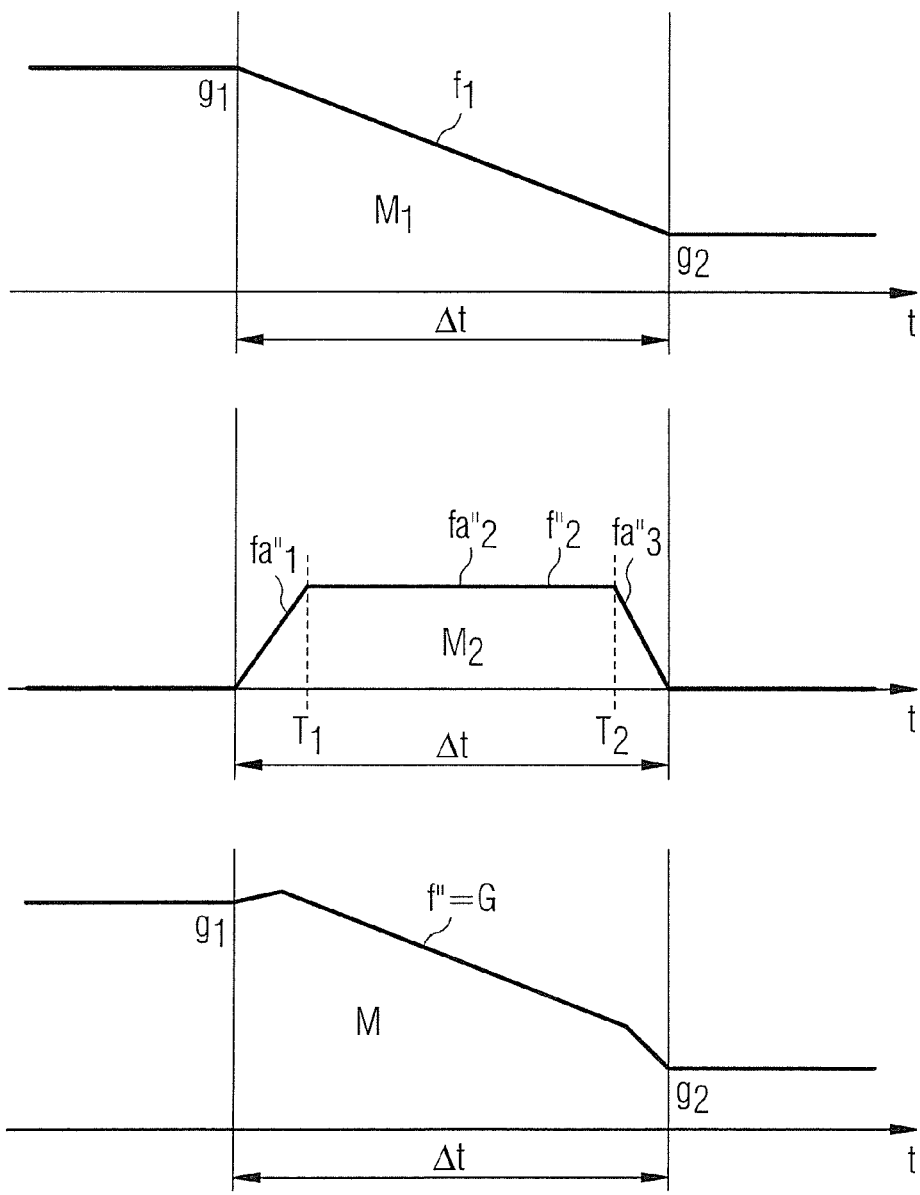

METHOD AND DEVICE FOR OPTIMIZATION OF A PULSE SEQUENCE FOR A MAGNETIC RESONANCE SYSTEM

BACKGROUND OF THE INVENTION

Field of the Invention

The invention concerns a method to optimize a pulse sequence for a magnetic resonance sequence. Moreover, the invention concerns a method to operate a magnetic resonance system using such an optimized pulse sequence, as well as a pulse sequence optimization device for a magnetic resonance system in order to implement such a method.

Description of the Prior Art

In a magnetic resonance system (also called a magnetic resonance tomography system), the body to be examined is typically exposed to a relatively high basic magnetic field—for example of 1, 5, 3 or 7 Tesla—by operation of a basic field magnet system, which often contains superconducting coils. A magnetic field gradient is additionally applied with the aid of a gradient system. Radio-frequency excitation signals (RF signals) are then emitted via a radio-frequency transmission system, which leads to the situation that the nuclear spins of specific atoms excited to resonance by this radio-frequency field are flipped (deflected) by a defined flip angle relative to the magnetic field lines of the basic magnetic field. Upon relaxation of the nuclear spins, radio-frequency signals (what are known as magnetic resonance signals) are radiated that are received by means of suitable radio-frequency antennas and then are processed further. Finally, the desired image data can be reconstructed from the raw data acquired in such a manner.

For a defined measurement, a defined pulse sequence is emitted that is composed of a series of radio-frequency pulses (in particular excitation pulses and refocusing pulses as well as gradient switchings emitted in coordination therewith) in different spatial directions. Readout windows must be set to match these chronologically. The readout windows predetermine the time periods in which the induced magnetic resonance signals are received. The timing within the magnetic resonance sequence—i.e. at which time intervals which pulses follow one another—is significant to the imaging. A number of the control parameters are normally defined in what is known as a measurement protocol, which is created in advance and retrieved (for example from a memory) for a specific measurement, and can be modified on site if necessary by the operator, who can provide additional control parameters such as (for example) a defined slice interval of a stack of slices to be measured, a slice thickness etc. A pulse sequence (also designated as a measurement sequence) is then calculated on the basis of all of these control parameters.

The gradient pulses are defined by their gradient amplitude, gradient pulse duration and edge steepness, i.e., the first derivative of the pulse shape dG/dt of the gradient pulses (typically designated as a "slew rate"). An additional important gradient pulse value is the gradient pulse moment (also shortened to "moment"), which is defined by the integral of the gradient amplitude over time.

During a pulse sequence, switching between the magnetic gradient coils from which the gradient pulses are emitted takes place often and quickly. Since the time specifications within a pulse sequence are for the most part very strict, and in addition to this the total duration of a pulse sequence (which determines the total duration of an MRT examination) must be kept as short as possible, at present gradient strengths around 40 mT/m and slew rates of up to 200 mT/m/ms must be achieved. In particular, such a high edge steepness contributes to noise development during the switching of the gradients. Eddy currents with other components of the magnetic resonance tomograph (in particular the radio-frequency shield) are one reason for these noise exposures. In addition to this, steep edges of the gradients lead to a higher power consumption and additionally place higher demands on the gradient coils and the additional hardware. The rapidly changing gradient fields lead to distortions and oscillations in the gradient coils, and to the transfer of these energies to the housing. A high helium boil-off of the vessel that contains the superconducting coils can additionally occur due to heating of the coils and the additional components.

In order to reduce the noise exposure, various solutions have been proposed in the design of the hardware, for example potting or vacuum sealing of the gradient coils.

In DE 10 2013 202 559 a method is described in that a finished pulse sequence which should be sent to the scanner of the magnetic resonance system is analyzed in order to determine the time interval within the pulse sequence that is to be optimized with regard to a gradient curve, or a gradient pulse. All original commands that are sent to the scanner are captured, then initially examined for optimizable regions. These regions are optimized, and only then does the forwarding to the scanner take place. The optimization preferably takes place with the use of a spline interpolation that satisfies defined boundary conditions, among other things a defined gradient moment, and/or a defined amplitude at predetermined node points, in particular at a start point in time of the respective interval and at an end point in time of the respective interval. An optimally smooth gradient curve with rounded edges is generated via the spline interpolation. However, the calculation of such a spline interpolation takes a relatively long time (especially in the case of longer gradient intervals), such that this could lead to the termination of the measurement if only a small amount of time is available for the optimization. This can be problematic given real-time applications.

SUMMARY OF THE INVENTION

An object of the present invention is to provide such a method and a corresponding pulse sequence optimization device for optimization of pulse sequences, which can be realized with relatively small effort and require less calculation time for optimization.

As in the aforementioned known method, in the method according to the invention for the optimization of a pulse sequence (which, as is typical, includes a number of radio-frequency pulses and a number of gradient pulses in chronological coordination therewith) initially takes place determination of at least one time interval that can be optimized, or is to be optimized, with regard to a gradient curve. As used herein, a gradient curve is the amplitude curve or function curve of a gradient pulse in the appertaining time interval. An entire series of optimizable time intervals is typically detected, as this is further explained below.

The determination of the optimizable time intervals can take place by an analysis of the finished sequence, as described above. In principle, however, such a determination can also already be implemented within a pulse design method, i.e. at a point in time at which the sequence has not yet been sent to the scanner but rather should be stored in a scan protocol, for example for a later use.

According to the invention, the determination of the time interval takes place under determination of specific boundary conditions for the gradient curve. These boundary conditions include: the time length of the appertaining time interval, a target integral of the gradient curve over the time interval (as noted, this integral is also designated as a 0th moment of the gradient curve), a start value of the gradient curve at the beginning of the time interval, and an end value of the gradient curve at the end of the time interval.

In a further step, a definition then takes place of the gradient curve within the defined time interval that complies with the aforesaid boundary conditions. For this purpose, a function that is linear per segment is defined by addition of a first linear function which connects the start value and the end value in a direct line and a second function that is linear per segment which respectively assumes a function value of "zero" at the beginning and end of the time interval (i.e. as a start value and as an end value). The second function that is linear per segment is thereby defined so that the sum of the integral of the first linear function and the integral of the second function that is linear per segment corresponds to the target integral. At this point, it is noted that—insofar as this is possibly while complying with the boundary conditions—a continuous linear function can also be used as an optimal gradient curve. In the sense of the invention, such a continuous linear function is also to be considered to be a function that is linear per segment.

In the method according to the invention, the respective simple, optimized gradient curves can thus be determined with very little computing power within the defined or selected time intervals, while complying with all boundary conditions. Relative to a spline interpolation, the optimization via definition of segments that are linear per function additionally has the advantage that even further reduced slew rates can be realized, since the maximum gradient changes can in principle be greater along a spline than on a straight line. The risk that the slew rates exceed the maximum allowable slew rate of the system is thus low. The single disadvantage relative to a spline interpolation is that the gradient curves have peaks at a few points, meaning that no rounding of the gradient curves is possible, such that in defined, short-term periods the higher frequencies are less strongly reduced in the acoustic spectrum than given a spline interpolation. Therefore, this procedure in particular suggests itself when slew rates that are too high are generated intermittently with a spline interpolation, or when the available computing time is insufficient for a complete spline interpolation.

As will be further shown below, it is the case according to the invention, as in the method according to DE 10 2013 202 559 described above, that a suitable pulse sequence optimization unit that implements the optimization can also be implemented in the existing sequence framework with relatively little effort.

In a method according to the invention for the operation of a magnetic resonance system, according to the inventive method described above, a pulse sequence is initially optimized and then the magnetic resonance system is operated using the optimized pulse sequence. The optimization is preferably implemented online in the, or directly before an execution of the pulse sequence, as explained below using examples.

A corresponding pulse sequence optimization unit to optimize a pulse according to the method according to the invention requires a time interval determination unit to determine a time interval in the appertaining pulse sequence that is to be optimized with regard to a gradient curve, based on the determination of the aforementioned boundary conditions for the gradient curve. Furthermore, the pulse sequence optimization device requires a gradient definition unit to define a gradient curve according to a function that is linear per segment via addition of a first linear function (which connects the start value and the end value) and a second function that is linear per segment (which assumes a function value of zero at the beginning and at the end of the time interval) so that the sum of the integral of the first linear function and the integral of the second function that is linear per segment corresponds to the target integral.

If it is desired that the pulse sequence optimization device should be able to analyze an already-produced pulse sequence for optimization thereof, for example before transmission to the scanner, the pulse sequence optimization device preferably has an input interface to receive the pulse sequence to be optimized and an analysis unit to analyze the pulse sequence, to identify defined time ranges (for example "fixed point time ranges") that are to be left unmodified, and the modifiable time intervals in the pulse sequence. This analysis unit then forms the time interval determination unit, which then must accordingly be able to determine the defined boundary conditions in the modifiable time intervals.

Insofar as it is desired (as explained below) to also implement other optimization methods, or an optimization under different optimization criteria if necessary, in addition to the optimization according to the invention for defined time intervals, the pulse sequence optimization device preferably has a corresponding pulse shape optimization unit which is in the position to optimize the pulse shape of the gradient pulses or, respectively, the gradient curve in the defined modifiable time intervals according to arbitrary predetermined optimization criteria. In this case, the gradient definition unit described above, which operates in the manner according to the invention, can also be part of this pulse shape optimization unit.

In addition to a typical radio-frequency transmission system, a gradient system, and a control device that is designed in order to control the radio-frequency transmission system and the gradient system to implement a desired measurement on the basis of a predetermined pulse sequence, a magnetic resonance system according to the invention has a pulse sequence optimization device according to the invention.

Insofar as a receipt and optimization of a pulse sequence to be transmitted to the scanner should be implemented, the pulse sequence optimization device is preferably part of the control device of the magnetic resonance system, and preferably is relatively closely situated upstream of the radio-frequency transmission system or, respectively, the gradient system.

At least significant parts of the pulse sequence optimization device can be designed in the form of software components. This in particular pertains to the time interval determination unit, and possibly the analysis unit and the gradient definition unit, and possibly the pulse shape optimization unit. Insofar as an input interface is required (as described) for a pulse sequence to be transmitted to the scanner, it can (for example) be an interface in order to receive data regarding a pulse sequence from a data store over a network, or in particular within a control device of a magnetic resonance system. The interface can be fashioned at least in part in the form of software and can access hardware interfaces of an existing computer.

The invention thus also encompasses a non-transitory computer-readable data storage medium that can be loaded directly into a memory of a pulse sequence optimization device, with program code segments in order to implement all steps of the method according to the invention when the program is executed in the pulse sequence optimization device. Such a realization in software has the advantage that previous control devices of magnetic resonance systems can be suitably modified by implementation of the program in order to optimize pulse sequences in the manner according to the invention, which pulse sequences have with the aforementioned advantages, for example.

In a preferred embodiment, the definition of the gradient curve takes place so that the second function that is linear per segment is formed from a first function segment increasing linearly up to a defined point in time and a second function segment decreasing linearly as of the defined point in time. Such a second function that is linear per segment thus corresponds to a triangle shape. In a simple variant, the defined point in time is thereby simply the middle point of the time interval, meaning that the first function segment increases up to halfway through the duration of the time interval, and as of then the second function segment decreases linearly. The middle point of the time interval is particularly simple to determine, and therefore in this variant the function is also quickly determined.

Depending on the curve of the first linear function (which connects the start value and the end value in a straight line), the definition of the second function that is linear per segment that is added with this first linear function can lead to the situation that the slew rate of the curve path linear per segment is relatively low in one portion but is relatively high in a second portion. In order to define the gradient curve or curve path that is linear per segment overall so that optimally minimal slew rates are achieved, instead of a symmetrical isosceles triangle (in which the highest point lies precisely at the middle of the time interval) a precisely defined asymmetrical triangle can be chosen for the second function that is linear per segment, given which the defined point in time at which the first function segment adjoins the second function segment is chosen so that the rise of the finished gradient curve (which is combined via addition of the first linear function and the second function that is linear per segment) is, at the defined point in time, equal to the negative rise of the gradient curve as of the defined point in time. In other words, the defined point in time is chosen so that the slew rate during the rise up to this defined point in time coincides in terms of absolute magnitude with the rise after this defined point in time, and merely has a different algebraic sign. A method to determine a point in time that matches this is explained in detail below.

In conclusion, a check is preferably made as to whether the gradient curve in the time interval complies with pre-determined system specification parameters, preferably at least a maximum allowable gradient amplitude and/or a maximum allowable slew rate. If the appertaining system specification parameters are not complied with by the modified gradient curve, there are various possibilities:

In particular if the gradient curve exceeds the maximum allowable gradient amplitude in the time interval, the second function that is linear per segment can preferably be formed from a first function segment that rises linearly up to a defined first point in time and a third function segment that falls linearly as of a defined second point in time, as well as a second function segment that linearly connects the first and second defined points in time. The second function segment is thereby preferably formed so that the gradient curve has a constant value between the first and second defined point in time. In other words: the linear function in the aforesaid time interval is now chosen so that it has a trapezoidal shape. Although the slew rates are thereby somewhat higher at the two outer time segments, the gradient amplitude is reduced. Here as well, the first point in time and the second point in time can preferably be chosen so that the rise of the combined gradient curve (i.e. the gradient curve that has been completely totaled up) up to the predetermined first point in time (i.e. the rising edge of the trapezoid) is equal to the negative rise of the gradient curve as of the predetermined second point in time (i.e. the falling edge of the trapezoid).

As was explained above, in a preferred embodiment of the method a finished pulse sequence (i.e. a pulse sequence that is ready for transmission but can still be optimized with the aid of the method according to the invention) is initially received. This pulse sequence includes a number (i.e. one or more) of radio-frequency pulses (for example at least one excitation pulse and/or refocusing pulse) and a number of gradient pulses in chronological coordination with these. Within the pulse sequence the precise parameters of the radio-frequency pulses (i.e. the time position and shape) are determined precisely, just as the individual gradient pulses are exactly predetermined via specific parameters such as time length, amplitude, edge steepness. As is typical, the pulse sequence or, respectively, its parameters thereby result from the imaging task to be solved.

An automatic analysis of the pulse sequence additionally takes place in order to identify the fixed point time periods in the pulse sequence that are to be left unchanged, and in order to determine the modifiable time intervals in the pulse sequence that may be optimized.

As used herein, fixed point time periods are individual time points or time intervals in which the current values of the gradients must persist without modification capability so that the gradients can continue to satisfy their proper function. For example, numbering among these are slice selection gradients or gradients during the readout times that serve to achieve a specific coding at a defined point in time. Additional examples will be given later. In addition to these unmodifiable individual points or time periods at which a defined gradient must have a very specific value, however, there are interposed modifiable time intervals in which gradient pulses are arranged entirely or in part that—although they also satisfy a specific function—do not depend on the time specifications being precisely complied with and on a specific amplitude being present at a very exact point in time. It often merely requires that a predetermined amplitude is achieved before a specific point in time, that a predetermined amplitude is ramped down as of a specific point in time, or that at least a specific moment is achieved within a wider time range. In these time intervals, the gradient pulse shapes can be modified in principle while complying with the cited boundary conditions, such that these time intervals are provided for an optimization.

In a further step, the automatic optimization of gradient pulses then takes place in the modifiable time intervals according to the method according to the invention that is described above.

A pulse sequence in the form of chronologically successive sequential event blocks can advantageously be transmitted to a pulse transmission arrangement, which then directly controls the radio-frequency transmission system to emit the individual radio-frequency pulses or, respectively, the gradient system to emit the individual gradient pulses. In the method according to the invention, the transmission of the pulse sequence to a pulse transmission arrangement also preferably takes place in the form of such event blocks. Each event block thereby normally characterizes a specific event, for example the emission of a fat saturation pulse, a defined spoiler gradient, a defined repetition within a gradient echoes etc., wherein the individual events under the circumstances consist of multiple radio-frequency pulses or, respectively, switched readout windows as well as gradient pulses switched to match these. A switching of a readout window means the activation of a receiver for the magnetic resonance signals (for example an ADC, analog/digital converter) that is connected to reception coils of the magnetic resonance system.

Preferably, every incoming event block is thereby initially analyzed (in a test module, for example) to identify fixed point time periods and modifiable time intervals in the respective event block before the transmission to the pulse transmission arrangement. Depending on this, a new subdivision of the pulse sequence into outgoing event blocks then takes place. This new subdivision preferably takes place so that an event block includes either only one fixed point time period or a modifiable time interval. In other words: the fixed point time periods and the modifiable time intervals are relayed (by the test module, for example) to the pulse transmission arrangement as separate outgoing event blocks, wherein adjoining fixed point time periods and adjoining modifiable time intervals in adjoining incoming event blocks are particularly preferably merged into new outgoing event blocks. According to the invention, the outgoing event blocks which include a modifiable time interval are then initially subjected to the optimization step to optimize the pulse shape before they are then transmitted to the pulse transmission arrangement. The outgoing event blocks which, in contrast to this, consist only of a fixed point time period are relayed unmodified to the pulse transmission arrangement, possibly after a delay so that they again arrive at the pulse transmission arrangement so as to chronologically matching the outgoing event blocks that have been optimized in the meanwhile.

This pulse transmission arrangement then executes the unoptimized event blocks and the optimized event blocks in succession in the matching order, meaning that it sends the corresponding control commands to the radio-frequency transmission system and the gradient system so that the entire optimized pulse sequence is emitted in the corrected temporal manner, preferably with an unmodified timing as before the optimization.

There are various possibilities to identify or analyze the time periods within the pulse sequence to establish whether they are a fixed point time period or an optimizable time interval.

A time period within a pulse sequence is preferably identified as a fixed point time period at least when, according to the pulse sequence, at least one of the following events should take place in the time period:

Emit a radio-frequency pulse. At the same time, a radio-frequency pulse is emitted so that it is to be assumed from this that the gradient switched at this time serves such that the radio-frequency pulse acts on a defined spatial volume. A modification of the amplitude during this time period would therefore lead to an adulteration of the sequence.

Read out raw data, i.e. set a readout window or, respectively, switch an ADC to be ready to receive. Here as well, the simultaneously switched gradients serve for a coding of in which spatial region the magnetic resonance signals are received. During this time period as well, a modification of the gradient amplitude would lead to an adulteration of the sequence.

Switch a flux compensation gradient pulse. This is comprised of two gradient moments of identical magnitude but different polarity. If this gradient pulse were modified, the flux compensation could be destroyed since the oppositely directed moment would be merged to form a null moment in the optimization.

Switch a diffusion gradient pulse. These diffusion gradient pulses also serve to apply a defined gradient amplitude over very specific time periods in order to thus achieve a specific coding of the signal. Therefore, a modification would also lead to an adulteration of the measurement here.

Switch a knock gradient pulse. Such knock gradient pulses (also called "tok-tok-tok pulses") serve to generate a defined knock noise at the beginning of a measurement, which noise is not too loud but also not too quiet. The patient located in the tomograph can prepare himself for the situation that the measurement now begins with a (normally unavoidable) noise exposure. If such knock gradient pulses were to be subjected to a noise optimization, for example, this would lead to a noise reduction of the knock gradient pulses, which then no longer satisfy their function of forewarning the patient.

It should be understood that gradient pulses that are "not modifiable" per se may possibly also include optimizable time intervals, for example in the manner that (for example) the edges can be modified as long as the plateau parameters (height and length) are maintained.

The identification of a time period within a pulse sequence as a fixed point time period or as a modifiable time interval can preferably take place accordingly via at least one of the following procedures:

Analyze the radio-frequency pulse transmission times;
Analyze the readout times;
Analyze the shape of the gradient pulses, for example in that these are compared with predetermined template pulse shapes for defined, unmodifiable gradient pulses. If a gradient pulse corresponds to this template pulse shape, this is an indication that it is such an unmodifiable gradient pulse;
Analyze designators included in an event block pulse sequence, for example names, flags etc. that indicate that the following gradient pulse in the appertaining gradient pulse is an unmodifiable gradient pulse. For example, an event block that includes a specific gradient pulse can include the individual amplitude values at defined points in time predetermined in a fixed sampling grid. Alternatively, however, the parameters about a rise time; the maximum amplitude to be achieved after a defined time; the duration of a plateau time in which the amplitude can be kept constant; and a decline time can also be included in order to completely define the gradient pulse. In both cases, the event block or event block parameter set can also additionally include an information as to whether the event block includes an unmodifiable pulse or even a coding or, respectively, designation as to what type of gradient pulse it is, for example a flux compensation gradient pulse, a diffusion gradient pulse etc.

Moreover, it is also possible not only that the aforementioned gradient pulse types are defined as unmodified, but also that additional gradient pulses or gradient pulse types are established as unmodifiable for the specific pulse sequence as needed, for example in that the test module is adjusted accordingly in order to identify such defined, unmodifiable additional gradient pulses and/or in that corresponding designators for these pulses are placed in the event block parameter set, for example.

The preferred embodiments described above show that it is possible in a relatively simple manner to identify the fixed point time periods and then to optimize the remaining time intervals. In particular, such fixed point time periods in the gradient pulses can be relatively simply differentiated from what are known as gradient spoiler pulses.

As described in DE 10 2013 202 559, in principle arbitrary optimization criteria can also be provided for the optimizable time intervals. However, as noted such optimization methods normally require somewhat more computing time. Therefore, in the method according to the method an optimization time that is provided for the definition of the gradient curve is particularly preferably initially determined for a defined (current) time interval that is to be modified. Depending on this, it is then initially decided whether a definition of the gradient curve in the modifiable time intervals takes place with the method according to the invention in that a function of the gradient curve that is linear per segment is determined in the time interval, or whether the gradient curve in the modifiable time interval is optimized by means of a different optimization method (in particular by means of a spline interpolation method). It is then preferably a 4th-order spline interpolation method. Corresponding to this decision, a modification of the gradient curve is then implemented, meaning either that an optimization takes place according to the predetermined optimization criterion (for example with the spline interpolation method) or—if the available optimization time is too short (for example is below a limit value)—a definition of the gradient curve takes place according to the invention via functions that are linear per segment.

Insofar as the optimization time is sufficient, in principle arbitrary optimization criteria can be predetermined. Reference can again be made to DE 10 2013 202 559, the content of which with regard to the different optimization criteria and optimization methods (in particular the spline interpolation) is incorporated herein by reference.

In the method according to the invention, the pulse curves in the individual gradient directions are also respectively optimized separately, meaning that the pulse shape or, respectively, the gradient curve is considered and optimized separately in each gradient direction, for example x-, y-, z-direction or, respectively, slice selection direction; phase coding direction; and readout direction.

In the present invention, as in DE 10 2013 202 559, the possibility of pulse-spanning optimization is also similarly provided.

Independently of in which manner the definition of the gradient curve in the modifiable time interval has taken place—i.e. independently of whether a definition takes place via a function that is linear per segment or whether a different optimization method has possibly also been used (insofar as the optimization time is sufficient)—the finished pulse shape can finally be checked again for compliance with predetermined system specification parameters.

If the system specification parameters are not complied with (for example the maximum allowable gradient amplitude and/or the maximum allowable slew rate are exceeded), the optimized pulse shape cannot be used. In this case, the pulse shape in the time interval is preferably replaced again with the original pulse shape.

To accelerate the method in a further preferred variant, before an optimization of a time interval a check can also initially be made as to whether the required gradient curve has already been calculated once. In many sequences, a relatively high number of repetitions of identical sequence segments is required. In this case, necessary gradient curves always occur again. In these cases, a recalculation can be foregone in that the optimized gradient curves are simply stored with corresponding identification possibilities, and these are then resorted to again. For example, finished, calculated gradient curves can be reused for specific boundary conditions if these deal with generating an optimized gradient curve for the same boundary conditions again. For example, such a method is described in DE 10 2013 213 255.

Through the method according to the invention, in addition to the advantages of the method of the cited documents the advantage of an extremely fast calculation of a new curve path can now additionally be achieved, wherein even more significantly reduced slew rates are achieved in [art. An optimization of very short event blocks as well as of regions that could previously not be optimized is therefore also possible. In particular, a real-time application is facilitated via the fast calculation.

BRIEF DESCRIPTION OF THE DRAWINGS

FIG. 9 is a depiction of a gradient curve defined according to the invention, according to a function that is linear per segment (lower graphic), and the first linear function (upper graphic) and second function that is linear per segment (middle graphic) that are used for this, according to a third embodiment.

DESCRIPTION OF THE PREFERRED EMBODIMENTS

In the following, the invention is described in an example of an implementation in the pulse sequence optimization device or of a use within the optimization method as they are explained in detail as an exemplary embodiment in DE 10 2013 202 559. However, at this point it is explicitly noted that the invention can also be used in other forms, for example directly in the pulse design or, respectively, the original calculation or preparation of the pulse sequence.

Figure 1:
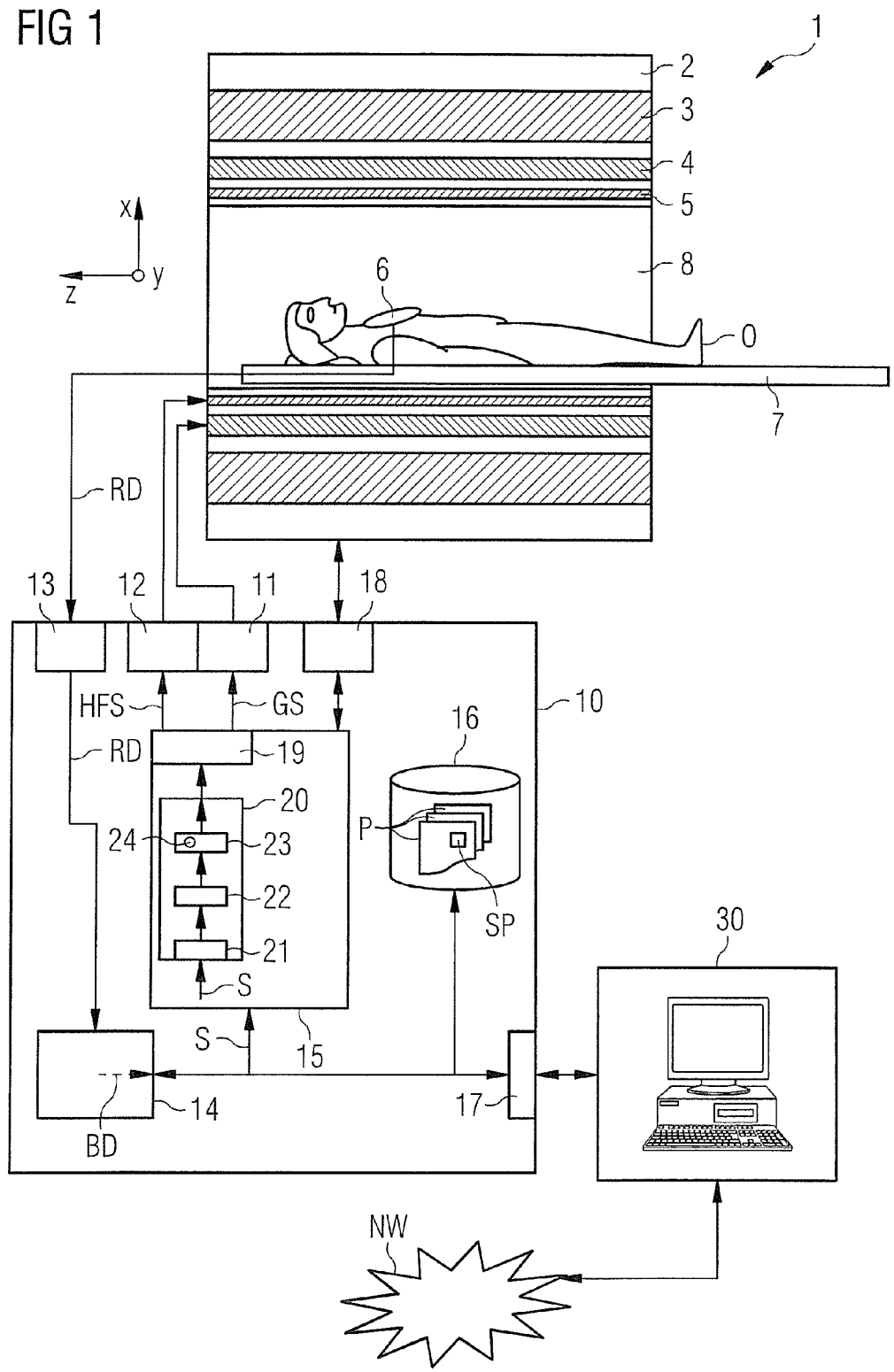
FIG. 1 is a schematic depiction of an exemplary embodiment of a magnetic resonance system according to the invention.

Roughly schematically shown in FIG. 1 is a magnetic resonance system 1 set up according to the invention. On the one hand, it comprises the actual magnetic resonance scanner 2 with an examination space 8 or, respectively, patient tunnel 8 located therein. A bed 7 can be driven into this patient tunnel 8, such that a patient O or test subject lying on can be supported at a specific position within the magnetic resonance scanner 2 relative to the magnet system and radio-frequency system arranged therein or, respectively, can also be driven between different positions during a measurement.

Essential components of the magnetic resonance scanner 2 are a basic field magnet 3, a gradient system 4 with magnetic field gradient coils to generate magnetic field gradients in the x-, y- and z-direction, and a whole-body radio-frequency coil 5. The magnetic field gradient coils in the x-, y- and z-directions are controllable independently of one another, such that via a predetermined combination gradients can be applied an arbitrary logical spatial directions (for example in the slice selection direction, in the phase coding direction or in the readout direction), wherein these directions normally depend on the selected slice orientation. The logical spatial directions can likewise also coincide with the x-, y- and z-directions, for example slice selection direction in the z-direction, phase coding direction in the y-direction and readout direction in the x-direction. The reception of magnetic resonance signals induced in the examination subject O can take place via the whole-body coil 5 with which the radio-frequency signals are normally also emitted to induce the magnetic resonance signals. However, these signals are typically received with a local coil arrangement 6 with local coils placed on or below the patient O, for example (of which here only one is shown). All of these components are known in principle to the man skilled in the art, and therefore are only roughly schematically shown in FIG. 1.

The components of the magnetic resonance scanner 2 can be controlled by a control device 10. This can thereby be a control computer that can also comprise a plurality of individual computers, which are possibly also spatially separated and connected among one another via suitable cables or the like. Via a terminal interface 17, this control device 10 is connected with a terminal 30 via which an operator can control the entire system 1. In the present case, this terminal 30 is equipped as a computer with a keyboard, one or more monitors and additional input devices (for example a mouse or the like) so that a graphical user interface is provided to the operator.

Among other things, the control device 10 has a gradient control unit 11 that can in turn be comprised of multiple sub-components. Via this gradient control unit 11, the individual gradient coils are generation device with control signals according to a gradient pulse sequence GS. As described above, these are hereby gradient pulses that are placed (executed) at precisely provided time positions and with a precisely predetermined time curve during a measurement.

Moreover, the control device 10 has a radio-frequency transmission unit 12 in order to feed respective radio-frequency pulses into the whole-body radio-frequency coil 5 according to a predetermined radio-frequency pulse sequence RFS of the pulse sequence MS. The radio-frequency pulse sequence RFS includes the excitation pulses and refocusing pulses noted above. The reception of the magnetic resonance signals then occurs with the aid of the local coil arrangement 6, and the raw data RD received by this are read out by an RF reception unit 13 and processed. The magnetic resonance signals are passed as raw data RF in digital form to a reconstruction unit 14 that reconstructs the image data BD from them, and stores these image data BD in a memory 16 and/or passes them via the interface 17 to the terminal 20 so that the operator can view them. The image data BD can also be stored and/or displayed and evaluated at other locations via a network NW. Alternatively, a radio-frequency pulse sequence can be emitted via the local coil arrangement and/or the magnetic resonance signals can be received by the whole-body radio-frequency coil (not shown) depending on state of connection of the whole-body radio-frequency coil 5 and the coil arrangements 6 with the radio-frequency transmission unit 12 or RF reception unit 13.

Via an additional interface 18, control commands are transmitted to other components of the magnetic resonance scanner 2 (for example the bed 7 or the basic field magnet 3) or measurement values or other information are received.

The gradient control unit 11, the RF transmission unit 12 and the RF reception antenna 13 are respectively controlled in coordination via a measurement control unit 15. Via corresponding commands, this ensures that the desired gradient pulse sequences GS and radio-frequency pulse sequences RFS are emitted. Moreover, for this it must be ensured that the magnetic resonance signals are read out at the local coils of the local coil arrangement 6 by the RF reception unit 13 at the matching point in time and are processed further. The measurement control unit 15 likewise controls the interface 18. For example, the measurement control unit 15 can be made up of a processor or multiple interacting processors. A pulse sequence optimization device 20 according to the invention can thereupon be implemented (for example in the form of suitable software components), which will be explained in more detail later.

The basic workflow of such a magnetic resonance measurement and the cited components for control (apart from the here specially designed pulse sequence optimization device 20) are known to the man skilled in the art, such that they are not addressed further here in detail. Moreover, such a magnetic resonance scanner 2 and the associated control device can still have a plurality of additional components that are likewise not explained in detail here. At this point it is noted that the magnetic resonance scanner 2 can also be of different design, for example with a laterally open patient space or as a smaller scanner in which only one body part can be positioned.

In order to start a measurement, from a memory 16 an operator can typically select a control protocol P provided for this measurement via the terminal 30, in which memory are stored a plurality of control protocols P for different measurements. Among other things, this control protocol P includes different control parameters SP for the respective measurement. Numbering among these control parameters SP are defined basic rules for the desired pulse sequence, for example the sequence type, i.e. whether it is a spin echo sequence, a turbo spin echo sequence etc. Furthermore, counting among these are: control parameters with regard to the magnetizations to be achieved via the individual radio-frequency pulses; specifications about a k-space gradient trajectory to be traversed to acquire raw data; and moreover slice thicknesses, slice intervals, number of slices, resolution, repetition times, the echo times in a spin echo sequence etc.

Through the terminal 30, the operator can modify a portion of these control parameters in order to create an individual control protocol for a current desired measurement. For this, modifiable control parameters are offered for modification on a graphical user interface of the terminal 30, for example.

Moreover, the operator can also retrieve control protocols (from a manufacturer of the magnetic resonance system, for example) via a network and then modify and use these as necessary.

Based on the control parameters SP, a pulse sequence S or measurement sequence S is then determined with which the actual control of the remaining components ultimately takes place via the measurement control unit 15. The pulse sequence S can be calculated or designed in a pulse sequence determination device that, for example, can be realized in the form of software components at the computer of the terminal 30. In principle, however, the pulse sequence determination device can also be part of the control device 10 itself, in particular the measurement control unit 15. However, the pulse sequence determination device could also be realized at a separate computer system which, for example, is connected with the magnetic resonance system via the network NW.

Upon execution of a pulse sequence S, this is initially optimized by the measurement control unit 15 in the manner according to the invention in a pulse sequence optimization device 20 before it is supplied via a pulse transmission arrangement 19 of the measurement control unit 15, which ultimately passes the radio-frequency pulse sequence RS to the RF transmission unit 12 and the gradient pulse sequence GS to the gradient control unit 11. For this purpose, this pulse sequence optimization device 20 includes an input interface 21 in order to accept the (actually finished, transmission-ready but to be optimized) pulse sequence S and pass it to an analysis unit 22, which implements the analysis of the pulse sequence to identify fixed point time periods and modifiable time intervals that may be optimized. In the shown exemplary embodiment, this analysis unit 22 thus forms the time interval determination unit 22 used according to the invention to determine a time interval to be optimized with regard to the gradient curve.

In a pulse shape optimization unit 23, the pulse shape of gradient pulses in the modifiable time intervals is then optimized. In principle, this can take place as in DE 10 2013 202 559 with regard to an arbitrary provided optimization criterion, in particular with regard to the 1st derivative of the gradient curve in order to achieve a noise reduction, for example. For example, diverse optimization criteria can be provided by an operator via the terminal 30 and/or be stored in a memory. In the present case, the pulse sequence optimization unit according to the invention additionally includes a gradient definition unit 24 that defines the gradient curve in the manner according to the invention as a function that is linear per segment.

The precise functionality of these components is depicted in the following using FIGS. 2 through 9 in an example of a generation and additional processing of a pulse sequence S, wherein various optimization variations are preset by means of functions that are linear per segment.

Figure 2:
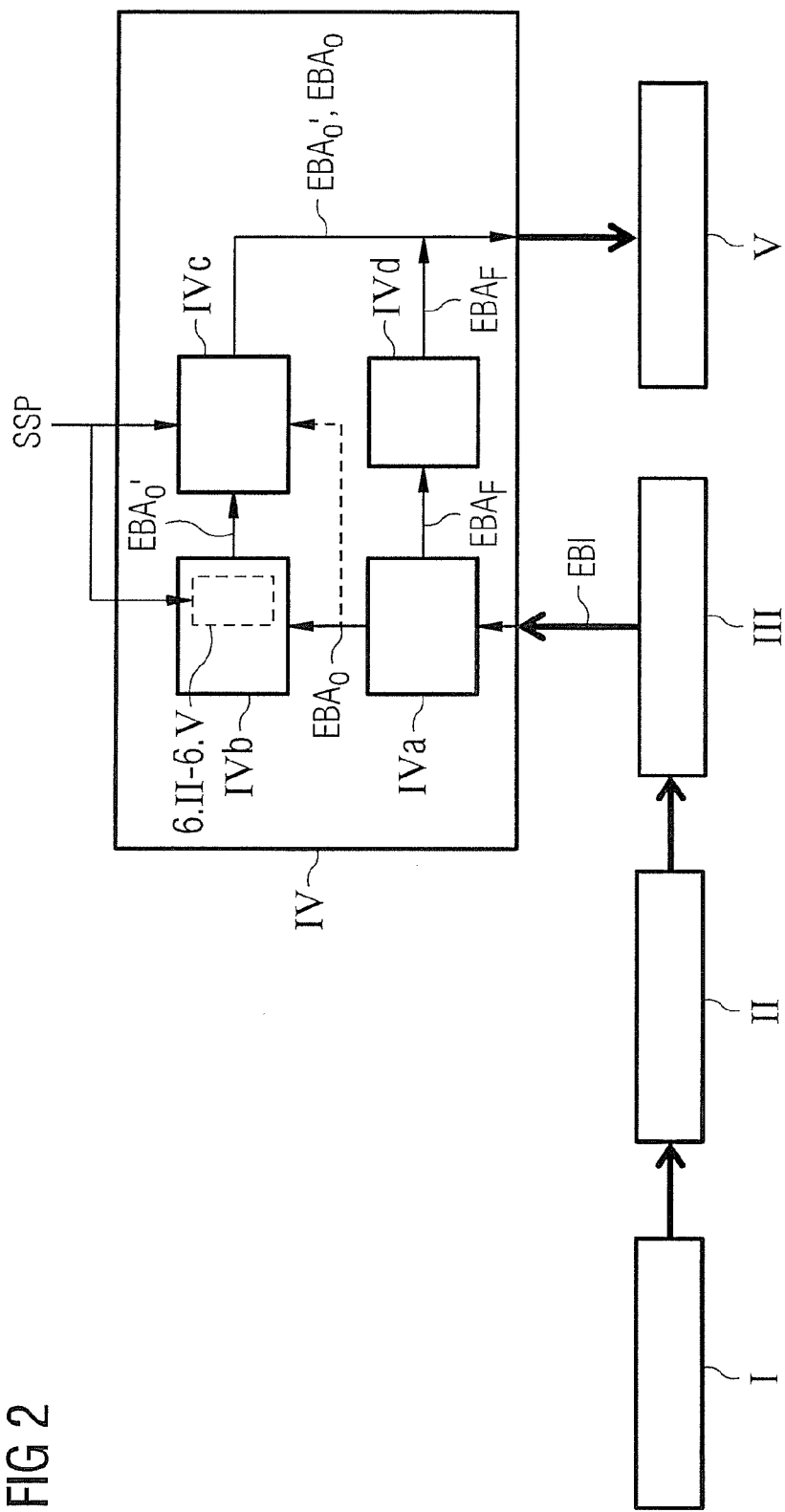
FIG. 2 is a flowchart of an exemplary embodiment of an optimization method using the invention.

The method that is depicted in FIG. 2 thereby essentially corresponds to the method that is preferably used in DE 10 2013 202 559, with the exception that additional testing and optimization steps are now implemented in step IVb, as is further explained below.

As is shown in FIG. 2, the method initially begins in step I in a typical manner with the preparation of the pulse sequence S. This means that, among other things, the sequence type is established or, respectively, a corresponding protocol is sought in which a specific sequence type is defined. The receipt of the required parameters, or if necessary, also modifications to these parameters, are performed by the user. In step II, the precise timing and the workflow of the pulse sequence are then calculated with the predetermined, defined sequence parameters. In step III, the relaying of the transmission-ready but not yet optimized pulse sequence takes place in the form of event blocks. Without application of the method according to the invention, a direct relaying of the event blocks to the pulse transmission arrangement 19 could take place in step III, which pulse transmission arrangement 19 then executes the event blocks in step V and ensures that the entire pulse sequence S is executed. According to the invention, however, a processing of the individual event blocks takes place in step IV before the relaying of the event blocks. Since the execution of the pulse sequence S in steps II, III, IV and V takes place sequentially in the form of individual event blocks, these steps can accordingly take place chronologically in parallel, meaning that later event blocks are still located in step II while earlier event blocks are already passed to the pulse transmission arrangement 19 in step V.

Figure 3:
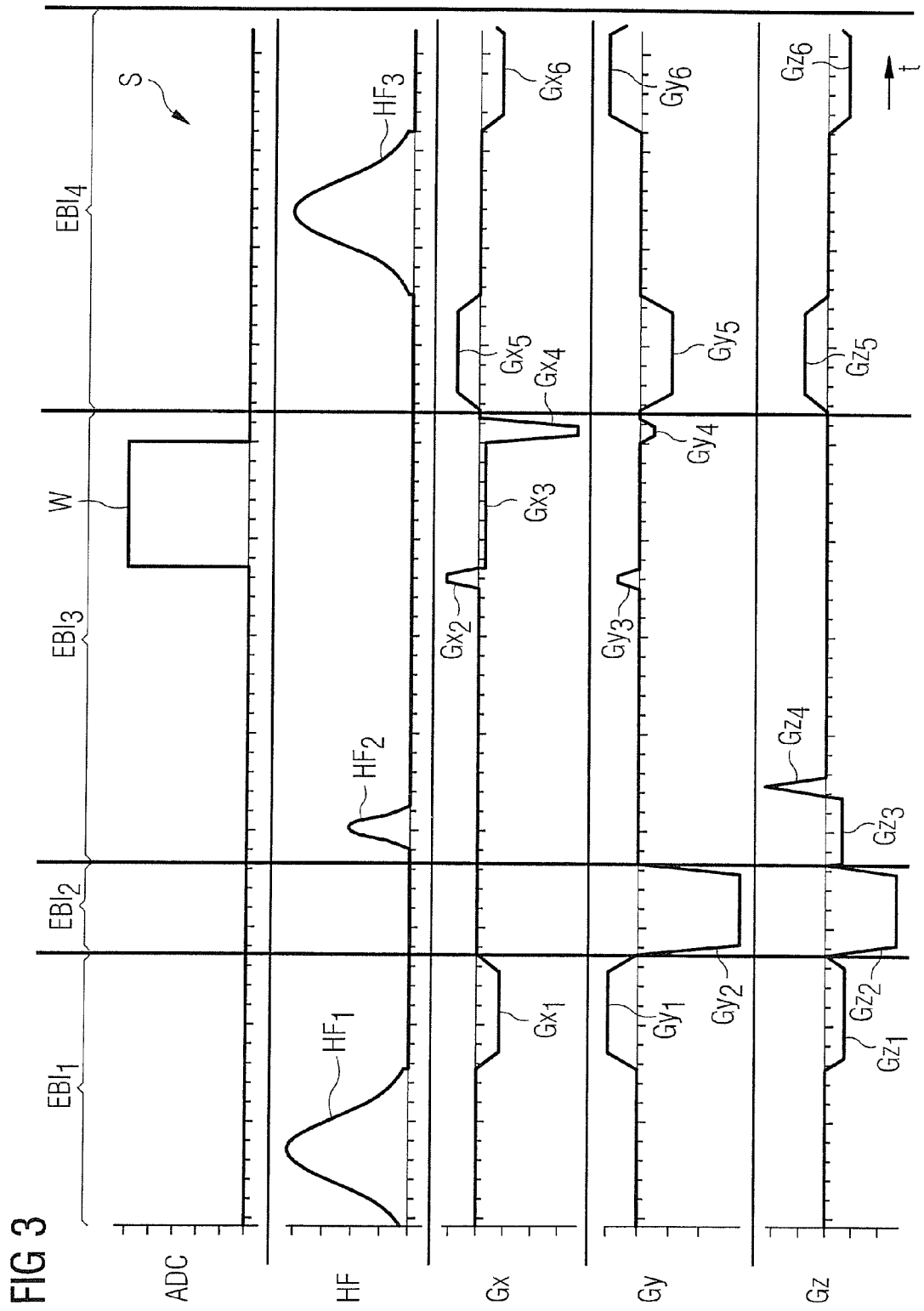
FIG. 3 shows an example pulse sequence to which the method according to the invention can be applied, subdivided into incoming event blocks.

A pulse diagram of the first part of a very simplified gradient echo sequence that is subdivided into event blocks $EBI_1$, $EBI_2$, $EBI_3$, $EBI_4$ is shown as an example in FIG. 3 (in FIG. 3 only the first three event blocks are shown completely, and the fourth is shown nearly completely). In this pulse diagram, the readout window W, the radio-frequency pulses $RF_1$, $RF_2$, $RF_3$ that are to be emitted and the gradient pulses are respectively shown in the typical manner on different overlapping time axes, depending on the time t. The readout window W is thereby shown on the uppermost readout time axis ADC, and the amplitudes of the radio-frequency pulses $RF_1$, $RF_2$, $RF_3$ that are to be emitted are shown on the second uppermost radio-frequency pulse time axis RF. The gradient pulses $Gx_1$, $Gx_2$, $Gx_3$, $Gx_4$, $Gx_5$, $Gx_6$ are shown on the gradient pulse time axis Gx situated below this. These are the gradient pulses in the readout direction. Shown on the second lowermost gradient pulse time axis Gy are the gradient pulses $Gy_1$, $Gy_2$, $Gy_3$, $Gy_4$, $Gy_5$, $Gy_6$ which are switched in the phase coding direction, and the gradient pulses $Gz_1$, $Gz_2$, $Gz_3$, $Gz_4$, $Gz_5$, $Gz_6$ in the slice selection direction are shown on the lowermost gradient pulse time axis Gz. The position of the time axis respectively indicates the zero line, meaning that the pulses in the gradients can be negative or positive gradient pulses depending on whether their amplitude extends downward or upward from the gradient pulse time axis Gx, Gy, Gz. In all pulse diagrams, for simplification, the scaling in the time direction and in the amplitude direction takes place only in arbitrary units since primarily only the comparison of the pulse curves or, respectively, shapes before and after the optimization is relevant to the understanding of the principle according to the invention.

The first event block $EBI_1$ of this pulse sequence S is an event block $EBI_1$ which should cause a fat saturation. Therefore, a relatively strong radio-frequency pulse $RF_1$ is initially emitted during which no gradient pulse is executed, such that the radio-frequency pulse $RF_1$ does not act in a slice-selective manner. However, immediately after the end of this radio-frequency pulse $RF_1$ three gradient pulse $Gx_1$, $Gy_1$, $Gz_1$ follow in all three spatial axes, which undesirably serve to dephase transversal magnetization generated via the fat saturation.

The next event block $EBI_2$ serves as a pre-spoiler. In this event block $EBI_2$, two negative gradient pulses $Gy_2$, $Gz_2$ are switched in the y-direction and z-direction. These pulses also serve to effectively dephase possibly present transversal residual magnetization that could have been generated or, respectively, refocused via preceding excitations or gradients.

The third event block $EBI_3$ includes a gradient echo sequence in which magnetic resonance signals are acquired in a defined volume or, respectively, a defined slice in that the volume is excited via a radio-frequency pulse $RF_2$ with simultaneous execution of a defined gradient $Gz_3$ in the slice selection direction $G_z$, and then a readout window W is placed (i.e. the ADC is switched to receive) while switching a defined gradient $Gx_3$ in the readout direction Gx. In this event block $EBI_3$, there are additional gradient pulses $Gz_4$, $Gx_2$, $Gy_3$, $Gx_4$, $Gy_4$ to dephase transversal magnetization generated by the excitation pulse in order to generate no unwanted echoes in the following event blocks.

An additional fat saturation event block $EBI_4$ then follows this gradient echo event block $EBI_3$, which fat saturation event block $EBI_4$ initially begins with three gradient pulses $Gx_5$, $Gy_5$, $Gz_5$ being switched in parallel in the x-, y- and z-direction; a non-slice-selective radio-frequency pulse $RF_3$ is then emitted, wherein all gradients are set to zero, and additional gradient pulses $Gx_6$, $Gy_6$, $Gz_6$ are subsequently emitted again in all three spatial directions. Additional event blocks can then subsequently follow, for example a new pre-spoiler, an additional repetition, a gradient echo event block etc.

As can be seen, each of these event blocks $EBI_1$, $EBI_2$, $EBI_3$, $EBI_4$ includes time periods that would in principle be optimizable. Here these are the time periods that do not fall under the criteria described above—for example that these are gradients that are emitted in parallel with one of the radio-frequency pulses $RF_1$, $RF_2$, $RF_3$ or the readout window W. Specific gradient pulses that are predominantly not modifiable—such as flow compensation gradient pulses, fusion gradient pulses or knock gradient pulses—are not included in the simplified sequence shown here.

Moreover, apart from the pre-spoiler event block $EBI_2$ all other event blocks $EBI_1$, $EBI_3$, $EBI_4$ also include fixed point time periods in which no variation of the gradient amplitude values is allowed and that are thus to be excluded from an optimization. Therefore, as shown in FIG. 2 the incoming event blocks EBI are checked within the method step IV (initially in a first method sub-step IVa) as to where the non-modifiable fixed point time periods are situated and where the modifiable or, respectively, optimizable time intervals are situated. A redivision of the pulse sequence S into outgoing event blocks $EBA_F$, $EBA_O$ also takes place in this step IVa.

Figure 4:
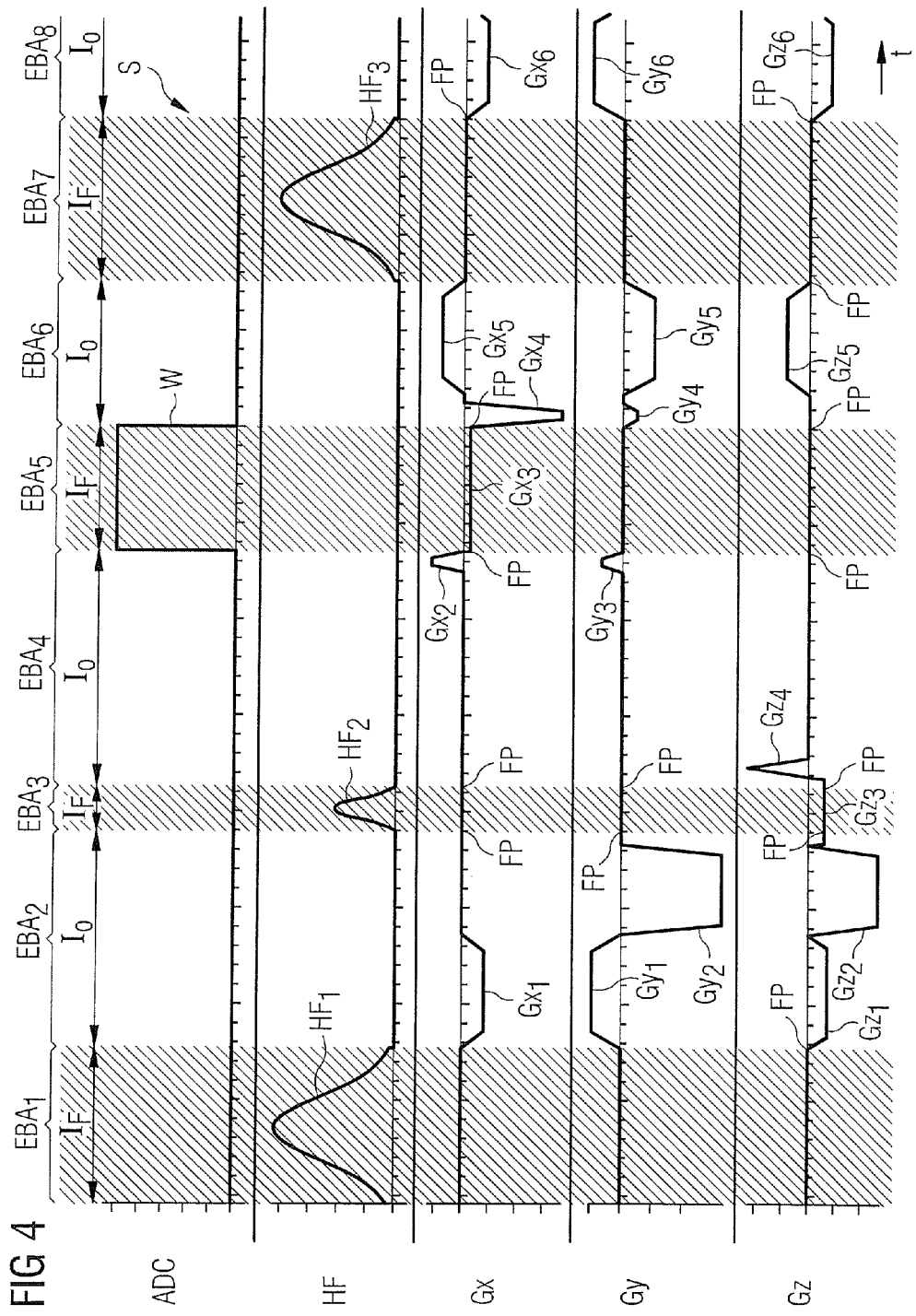
FIG. 4 shows the pulse sequence of FIG. 3, subdivided into outgoing, unmodifiable event blocks which include a fixed point time period and optimizable event blocks which include a modifiable time interval.
Figure 5:
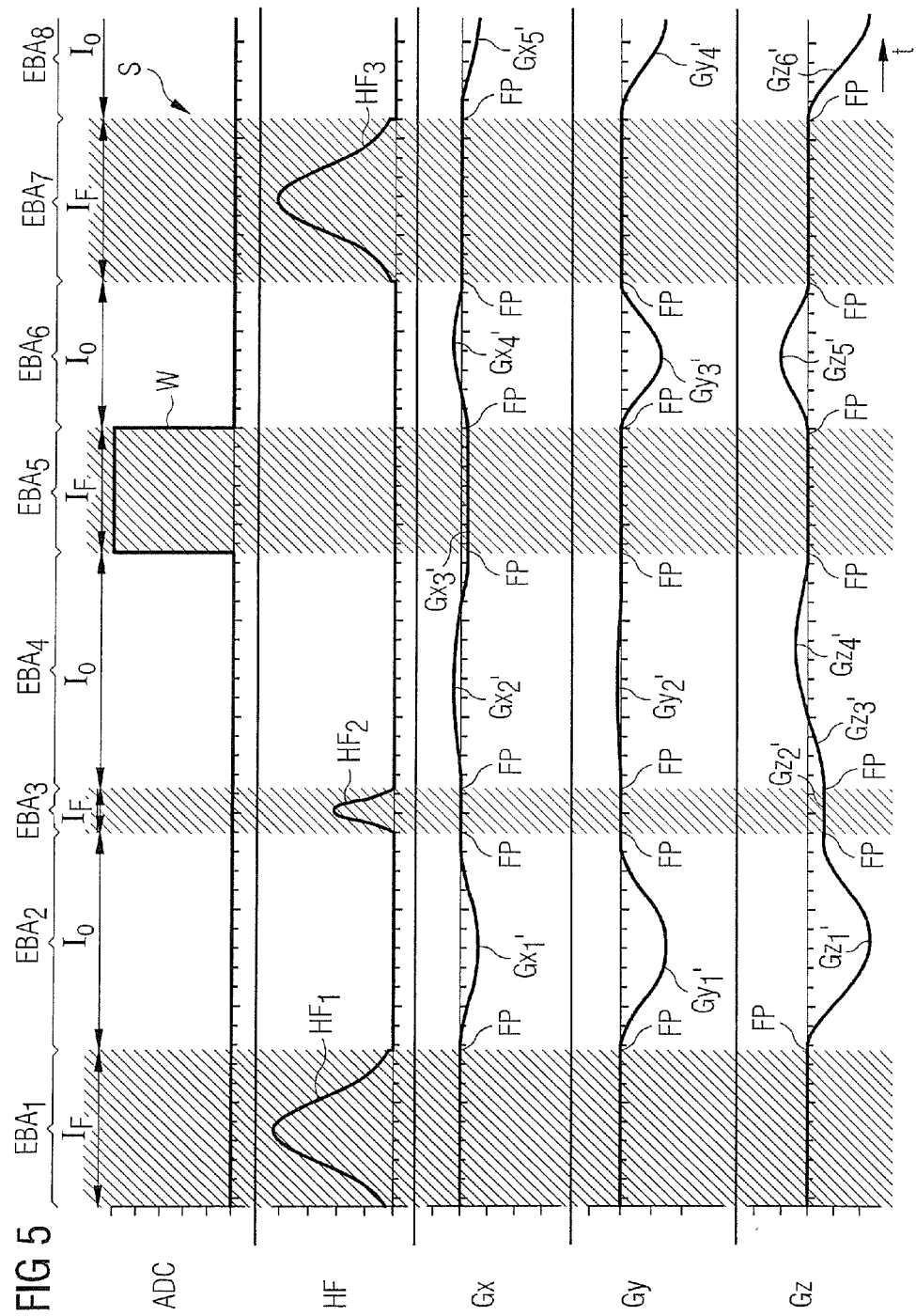
FIG. 5 shows the pulse sequence of FIG. 4 according to an optimization of the optimizable event blocks by spline interpolation.

This is depicted in FIG. 4 for the pulse sequence S from FIG. 3. Here the non-optimizable fixed point time periods $I_F$ are respectively covered by a cross-hatched pattern, and the optimizable time intervals $I_O$ are not covered. New outgoing event blocks $EBA_1$, $EBA_2$, ..., $EBA_8$ thereby result automatically, wherein these outgoing event blocks $EBA_1$, $EBA_2$, ..., $EBA_8$ include either precisely one fixed point time period $I_F$ or an optimizable time interval $I_O$. Here it is precisely the time periods in which the radio-frequency pulses $RF_1$, $RF_2$, $RF_3$ are emitted in parallel or the readout window W is switched that have been identified as unoptimizable time periods $I_F$. In these regions, the gradients must remain at the exact predetermined amplitude values. In the regions situated in-between, the pulse shapes or, respectively, the gradient curve may be varied arbitrarily under defined boundary conditions (for example that the amplitude values are maintained at the boundary points at the adjoining event blocks; that the length of the time interval $I_O$ remains unchanged; and that the total moment of the gradient pulses in the respective optimizable time periods is the same before and after the optimization). The optimizable event blocks $EBA_2$, $EBA_4$, $EBA_6$, $EBA_8$ are then optimized in an additional step IVb under the aforementioned boundary conditions (these optimizable event blocks are globally designated by the reference characters $EBA_O$ in FIG. 2).

The optimization in step IVb then possibly takes place using the spline interpolation method already explained in DE 10 2013 202 559, wherein the start and end values at the boundaries of the respective time interval $I_O$ are respectively viewed as fixed points FP, and a spline under predetermined boundary conditions (reaching the fixed points, maintaining the integral under the curve, retaining the length of the time interval $I_O$, and additionally setting the 1st derivative at the fixed point=0) leads to a desired smooth pulse shape in the respective optimizable time periods IO.

As is subsequently explained further using FIG. 6, however, additional testing steps (and possibly additional calculation steps) which deviate from a spline interpolation are implemented in step IVb. If it were to result in this additional testing steps [sic] that a spline interpolation for optimization can be implemented in all time intervals $I_O$ of the pulse sequence from FIG. 4, after the optimization the pulse sequence according to FIG. 5 would be present as a result. In particular, in FIG. 4 it can be seen how adjoining, relatively angular pulses with steep edges in gradient pulses $Gx_1'$, $Gx_2'$, $Gx_3'$, $Gx_4'$, $Gx_5'$, $Gy_1'$, $Gy_2'$, $Gy_3'$, $Gy_4'$, $Gz_1'$, $Gz_2'$, $Gz_3'$, $Gz_4'$, $Gz_5'$, $Gz_6'$ were converted with common pulse shapes that in part transition into one another, which pulse shapes are relatively smooth and therefore entail significantly smaller loads for the gradient coils, and thus significantly reduce the noise load.

As noted, however, the spline interpolation has the disadvantage that it requires a relatively large amount of calculation time. For this reason, the additional method steps 6.II through 6.V are now implemented in step IVb as they are explained in the following using FIG. 6. In FIG. 6, the entire method workflow is thereby described again, beginning with a step 6.I in which an optimizable time interval $I_O$ within the pulse sequence is initially determined. This essentially corresponds to step IVa in FIG. 2. Within step IVb in FIG. 2, in step 6.II according to FIG. 6 the boundary conditions are initially determined again, i.e. the start value and end value, the duration and the 0th moment M of the time interval $I_O$. Moreover, in this step a check is made as to whether sufficient optimization time is available in order to be able to implement a spline interpolation.

If this is the case ("y" branch), in step 6.III the spline curve is conventionally calculated, wherein the first derivatives at the boundary values are set equal to zero as additional boundary conditions. This method thus proceeds as in DE 10 2013 202 559. In a subsequent step 6.IV, the calculated spline curve is initially checked as to whether the defined, system-specific parameters SSP are complied with. In particular, a check is made as to whether the maximum allowable gradient amplitude and the maximum allowable slew rate are complied with. If this is the case ("y" branch), in step 6.VII a relaying of the optimized curve to the scanner can take place directly, meaning that the event block $EBA_O$ can be passed. This already corresponds to the method step V in FIG. 2. In this case, the method step IVc in FIG. 2 is superfluous.

However, if it is established in step 6.IV that the maximum allowable slew rate is exceeded ("n" branch), a calculation according to the invention of a gradient curve that is linear is segments initially takes place in step 6.V. This calculation in step 6.V of the curve that is linear per segment is also always implemented when it is established in step 6.II that the optimization time is not sufficient in order to calculate a spline curve at all ("n" branch going outward from 6.II).

Figure 7:
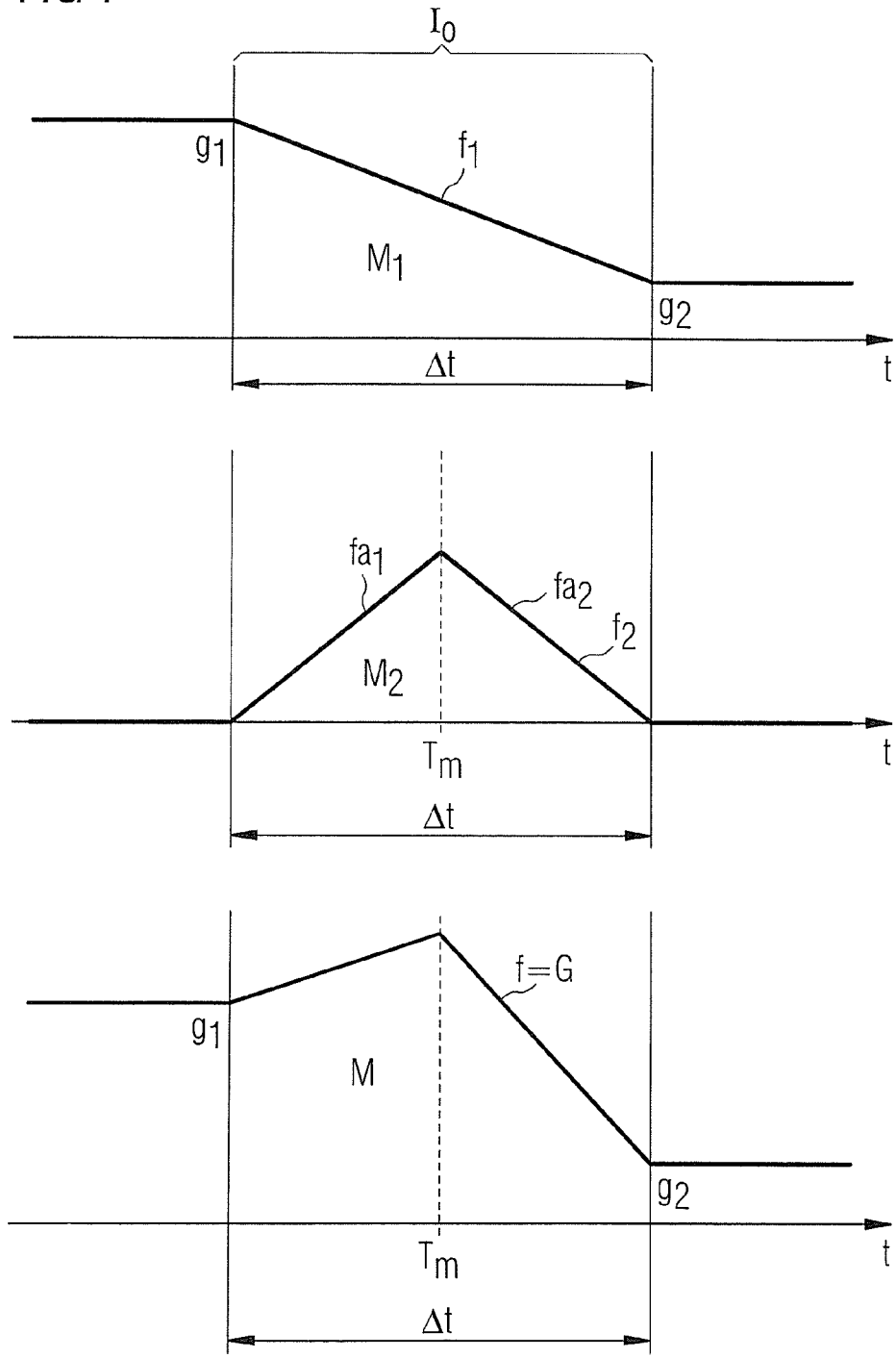
FIG. 7 is a depiction of a gradient curve defined according to the invention according to a function that is linear per segment (lower graphic), and the first linear function (upper graphic) and second function that is linear per segment (middle graphic) that are used for this, according to a first embodiment.
Figure 8:
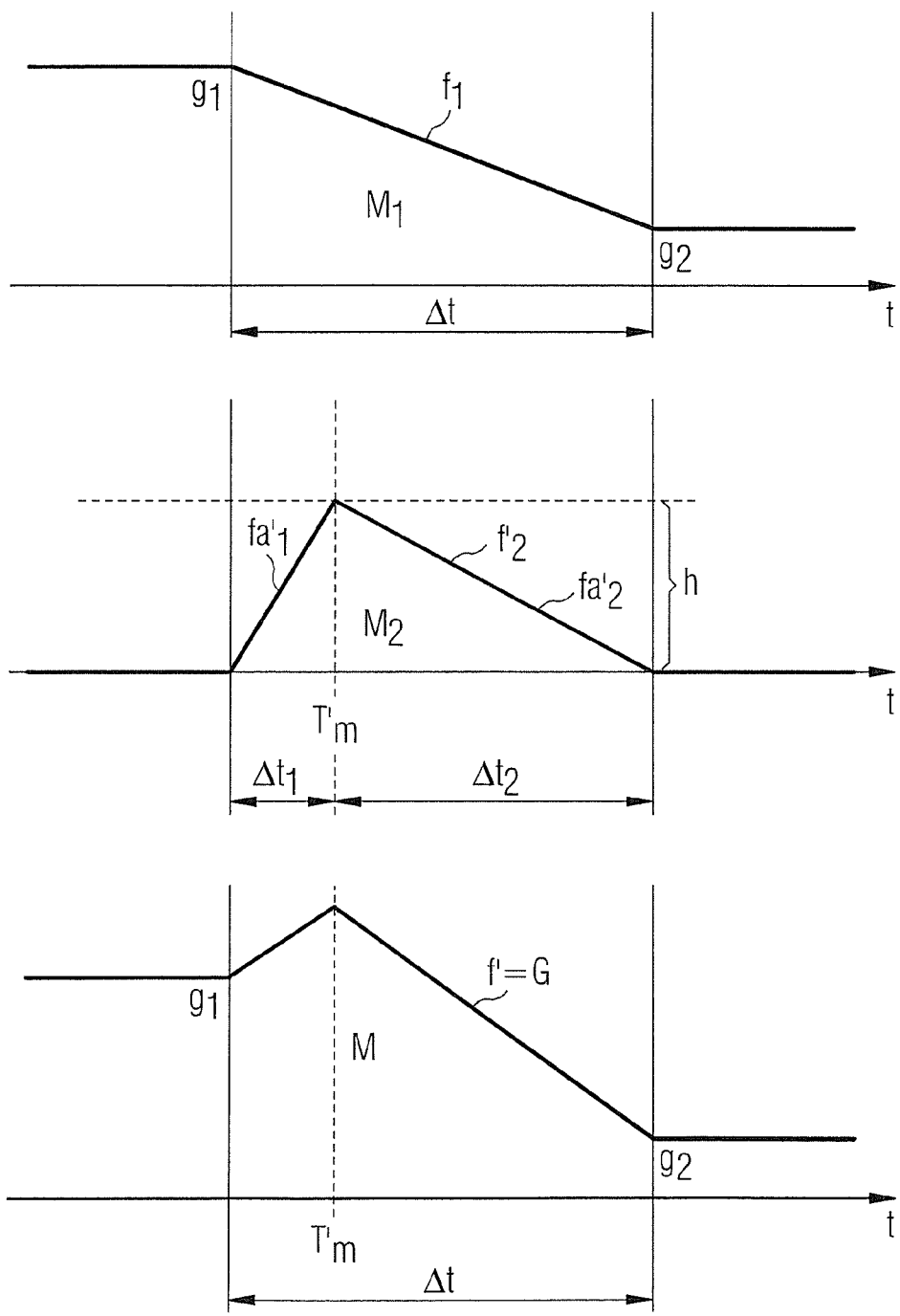
FIG. 8 is a depiction of a gradient curve defined according to the invention, according to a function that is linear per segment (lower graphic), and the first linear function (upper graphic) and second function that is linear per segment (middle graphic) that are used for this, according to a second embodiment.

FIGS. 7 through 9 show different possibilities to calculate an optimized gradient curve that is linear per segment, which gradient curve satisfies the boundary conditions that are determined in step 6.II.

In FIG. 7, a time interval $I_0$ that is to be optimized is shown with length $\Delta t$ in an upper graphic. Furthermore, the start value $g_1$ and the end value $g_2$ are drawn, which start value $g_1$ and end value $g_2$ must comply with the gradient curve as function values at the start and end of the respective time interval $I_0$ (in all graphics shown in FIGS. 7 through 9, the gradient amplitude is respectively shown over time t, wherein the amplitude and the time t are respectively shown in arbitrary units).

A first linear function $f_1$ is now defined that directly connects the start value $g_1$ in a straight line with the end value $g_2$. The integral below this first linear function $f_1$ is additionally determined. Moreover, a second function $f_2$ that is linear per segment is determined as this is shown in the middle graphic. The function curve of this function $f_2$ that is linear per segment is thereby defined so that a first function segment $fa_1$ rises linearly up to a defined point in time $T_m$ and a second, linear function segment $fa_2$ falls again linearly as of this defined point in time $T_m$. This second function segment $f_2$ that is linear per segment is defined so that it begins with a start value of zero at the beginning of the interval $I_0$ and ends again at the end with an end value of zero. In the example in FIG. 2, the defined point in time $T_m$ at which the function segments $fa_1$, $fa_2$ adjoin one another is precisely in the middle of the time interval $I_0$, i.e. after a time of $\Delta t/2$ after the beginning of the time interval $I_0$. This leads to the situation that, in the second function that is linear per segment, the slope of the second function segment $fa_2$ corresponds to the negative slope of the first function segment $fa_1$. This means that a precisely defined slew rate always exists.

The slopes of the linear function segments $fa_1$, $fa_2$ are chosen so that an integral $M_2$ is formed under the function $f_2$ that is linear per segment, which integral $M_2$, together with the integral $M_1$ of the first linear function $f_1$ that is shown in the upper diagram, corresponds to the target integral M, meaning that the desired target moment M is reached given a summation of the two functions. The gradient curve G for the time interval $I_0$ is then actually formed by adding up the first linear function $f_1$ and the second function $f_2$ that is linear per segment, which here is shown in the lower diagram.

The point in time at which the second function $f_2$ is maximum—i.e. rises up to the first function segment $fa_1$ and falls again as of the second function segment $fa_2$—does not necessarily need to lie in the middle of the time interval $I_0$.

In an additional preferred variant that is shown in FIG. 8, the point in time $T_m'$ at which the second function $f_2'$ that is linear per segment is chosen so that, in the later composite function f (i.e. in the finished gradient curve G), the slope up to the aforesaid point in time $T_m'$ is equal in terms of absolute value to the negative slope after this point in time $T_m'$. As is namely apparent from FIG. 7, depending on how the first linear function $f_1$ proceeds the selection of the second function $f_2$ that is linear per segment with the method described in FIG. 7 can lead to the situation that the slew rate is significantly greater within one of the two function segments than in the other. This can led to the situation that the maximum allowable slew rate is unnecessarily exceeded in one of the two function segments. In the method according to FIG. 8, this cannot occur. The ideal point in time $T_m'$ at which the second function $f_2'$ that is linear per segment exhibits its maximum (designated as a maximum point in time in the following) can be defined as follows:

The condition $$\frac{\Delta g}{\Delta t} + \frac{h}{\Delta t_1} = -\left(\frac{\Delta g}{\Delta t} - \frac{h}{\Delta t_2}\right) \quad (1)$$

results from the boundary condition for the second linear function $f_2$ that is linear per segment, that the slope of the gradient curve progression (see lower graphic in FIG. 8) should exhibit the same (in terms of absolute value) slope up to the maximum point in time $T_m'$ as after the aforesaid point in time $T_m'$. $\Delta g = g_2 - g_1$ is thereby the difference of the two function values $g_2$, $g_1$ at the start and end of the time interval $I_0$. $\Delta t_1$ is the time segment from the start of the interval $I_0$ up to the maximum point in time $T_m'$, i.e. the length of the first function segment $fa_1'$, and $\Delta t_2$ is the time segment between the maximum point in time $T_m'$ and the end of the time interval $I_0$, i.e. the length of the second function segment $fa_2'$. This means that it applies that $\Delta t_1 + \Delta t_2 = \Delta t =$ length of the entire time interval $I_0$.

h is the maximum amplitude of this second function $f_2'$ that is linear per segment, i.e. the function value at the maximum point in time $T_m'$. The maximum function value h is moreover unmodified relative to the method according to FIG. 7 since it furthermore applies that the integral $M_2$ under the curve is calculated according to simple triangular geometry according to $M_2 = \frac{1}{2} h \cdot \Delta t$.

By reformulating Equation (1), $$\Delta t_1 = \Delta t \cdot \left(\frac{1}{2} - \frac{2}{2 \cdot \Delta g} \pm \sqrt{\frac{h^2}{4 \cdot \Delta g^2} + \frac{1}{4}}\right) \quad (2)$$

is obtained. This equation has two solutions for $\Delta t_1$, wherein the solution is used for which it applies that $0 < \Delta t_1 < \Delta t$. Insofar as—in an exceptional case—no solution should be found (which is actually precluded), the method according to FIG. 7 can be resorted to, meaning that $\Delta t_1 = \frac{1}{2} \Delta t$ is used.

By summation of the second function $f_2'$ that is linear per segment with the first linear function $f_1$, the optimized triangular function f' that is shown below in FIG. 8 is then obtained that can be used as a gradient curve G. As is apparent from FIG. 8, this has the advantage that the slew rate on both sides of the maximum point in time $T_m'$ is the same, and thus there is a lower risk that the maximum allowable slew rate is exceeded.

The arising curve f' actually even has the lowest possible slew rate of all. Even with a spline interpolation, no lower slew rate is possible but a rounding of the curve is. Moreover, it automatically results from Equation (2) that the middle of the time interval $I_0$ is always also automatically the maximum point in time $T_m'$ if the start value $g_1$ is equal to the end value $g_2$. The same curve progression as in FIG. 7 the results.

Moreover, in step 6.V an additional check can take place, namely whether the maximum allowable gradient amplitude is exceeded. This value is also accepted as a system-specific parameter SSP in step IVb (see FIG. 2). For example, the system-specific parameters SSP can be stored in a memory.

If the maximum allowable gradient amplitude is exceeded, the total function must then be somewhat capped. For this, it is suggested to subdivide the second function $f_2''$ that is linear per segment into additional segments, for example into the trapezoidal shape that is shown in FIG. 9. Here as well, in the upper graphic the first linear function $f_1$ with the integral M is shown again, which first linear function $f_1$ connects the start value $g_1$ with the end value $g_2$ in a straight line. The second function $f_2''$ that is linear per segment is then shown in the middle graphic, which function $f_2''$ here consists of a first time segment $fa_1''$, a last (third) function segment $fa_3''$, and a second function segment $fa_2''$ connecting these two function segments $fa_1''$, $fa_3''$ in a straight line. In FIG. 9, the first point in time $T_1$, up to which the first function segment $fa_2''$ proceeds, and the second point in time $T_2$, as of which the third function segment $fa_3''$ proceeds, are chosen so that the slopes of the first and third function segment $fa_1''$, $fa_3''$ are the same (with flipped algebraic sign), and the function values at the two points in time $T_1$, $T_2$ are also identical, such that the second function segment $fa_2''$ is a constant. This leads to the symmetrical trapezoid in FIG. 9. Naturally, the second function $f_2''$ that is linear per segment is chosen so that here again the matching first moment or, respectively, integral $M_2$ is also present, such that the sum of the integral $M_1$ of the first linear function $f_1$ and of the integral $M_2$ of the second function $f_2''$ that is linear per segment yields the desired target integral M for the gradient curve G. This gradient curve G or, respectively, the function f'' that is assembled from the curves $f_1$ and $f_2''$ is shown in the lower graphic in FIG. 9.

Moreover, in a method in which such a trapezoid is used it can also moreover be ensured that the slew rate of the first function segment up to the point in time $T_1$ of the total function f'' is equal to the slew rate in the last function segment of the total function f'' after the second defined point in time $T_2$ (only with reverse sign). Furthermore, the slopes of the first function segment and of the last function segment could also be chosen so that the total function f'' continues to rise starting from the start value $g_1$, for example because this start value $g_1$ is already close to the maximum allowable gradient amplitude anyway, and then declines later somewhat as the first linear function $f_1$.

In a further step 6.VII, the gradient curve in the time interval $I_0$ (i.e. the finished optimized event block $EBA_O$) can then be checked again as to whether the system-specific parameters SSP are also really complied with. This fundamentally corresponds to the step IVc in FIG. 2.

Figure 6:
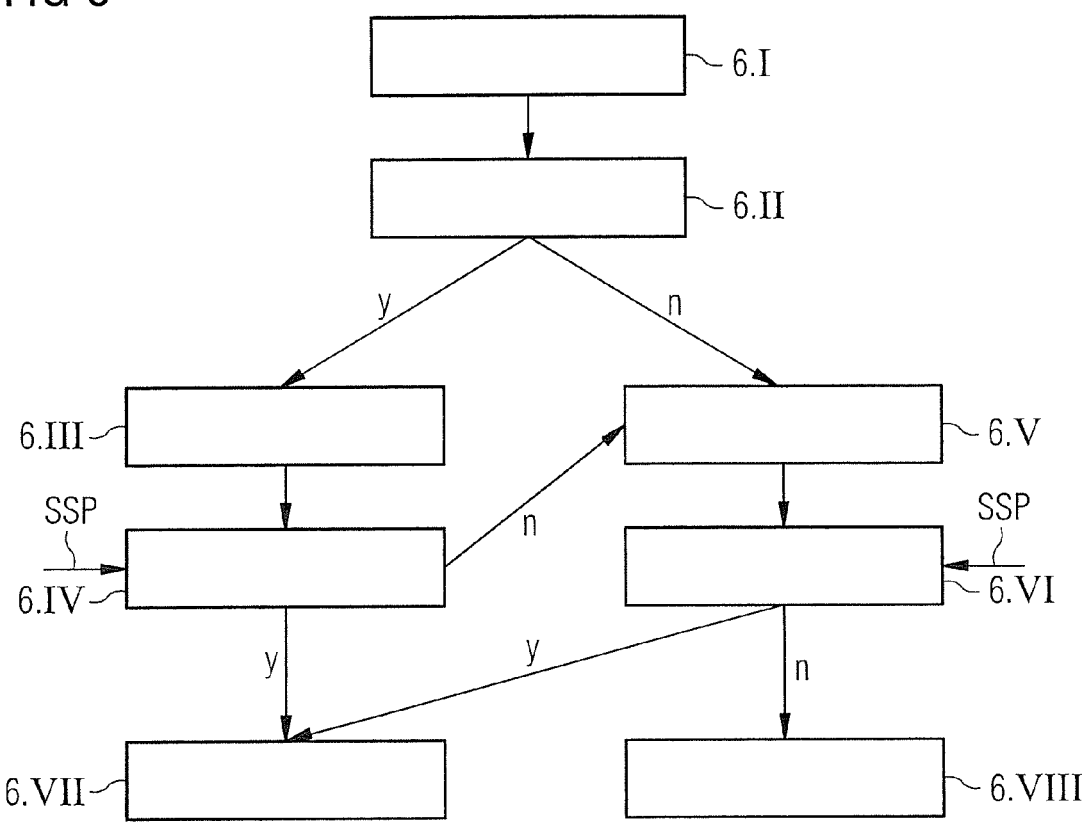
FIG. 6 is a flowchart of an exemplary embodiment of a method according to the invention, for example for use in the method according to FIG. 2.

If this is not the case ("n" branch of step 6.VI), the optimized event block $EBA_O'$ is thus again replaced with the original event block $EBA_O$, as is indicated by the dashed line in FIG. 2 and as this is represented by step 6.VIII in FIG. 6. However, it is typically to be assumed from this that the optimized event blocks $EBA_O'$ comply with these conditions ("y" branch from step 5.VI).

In step V in FIG. 2 (corresponds to step 6.VII in FIG. 6), the optimized event block $EBA_O'$ (or, in the individual case, the unoptimized event block $EBA_O'$) is then passed to the pulse transmission arrangement 10 and executed, wherein the pulse transmission arrangement 19 ensures that the unoptimizable event blocks $EBA_F$ are also executed in the matching order. For this purpose, the individual optimized $EBA_O'$ or optimizable $EBA_O$ and the unoptimizable event blocks $EBA_F$ are passed to the pulse transmission arrangement 19 in a matching chronological order. For example, the unoptimizable event blocks $EBA_F$ can thereby be delayed in a delay step IVd, such that they are passed only at the matching point in time.

Step IVa can also be explained so that the pulse sequence S is initially subdivided in its time curve into two different categories, i.e. into the optimizable event blocks and the unoptimizable event blocks. For example, if an radio-frequency pulse or a readout window is present, the associated time interval is associated with a category 0="unoptimizable"; in contrast to this, the category 1="optimizable" is associated with the intervening intervals of the pulse sequence S without such radio-frequency pulses or readout windows. Time intervals (the optimizable and unoptimizable event blocks) $[0, t_1]$, $[t_1, t_2]$, $[t_2, t_3]$ etc. are then created with alternating categories 0 and 1. The time intervals of category 1 are then subsequently optimized in the cited manner, for example by means of the spline interpolation method or via definition of the function that is linear per segment. The calculated gradient curve then replaces the original curve of all pulses in this interval, such that the moment of the gradient curve (and therefore the influence on the spin phase) is constant.

From the previously described example it is clear how, with the method according to the invention, each pulse sequence can effectively be optimized very quickly with regard to the noise exposure and loading of the gradient coils, immediately before the execution, without any variation of the timing being required, and consequently no changes of the image quality are also involved.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to optimize a pulse sequence for a magnetic resonance system, comprising:
   providing to, or generating in, a computer, a pulse sequence comprising a plurality of radio-frequency pulses and a plurality of gradient pulses that are to be chronologically coordinated with the radio-frequency pulses, said gradient pulses exhibiting a gradient curve;
   in said computer, automatically determining a time interval associated with said gradient curve and optimizing said gradient curve dependent on boundary conditions for said gradient curve selected from the group consisting of:
   (a) a length of said time interval,
   (b) a target integral of said gradient curve over said time interval,
   (c) a start value of said gradient curve at a beginning of said time interval, and
   (d) an end value of said gradient curve at an end of said time interval;
   optimizing said gradient curve by defining said gradient curve according to a function that is linear per segment by addition of a first linear function that connects said start value and said end value of said gradient curve, and a second function that is linear per segment that assumes a function value of zero at the beginning and the end of said time interval, and which is defined to cause a sum of said integral of said first linear function and the integral of the second liner function that is linear per segment to correspond to the target integral; and
   emitting the pulse sequence with the optimized gradient curve therein as an electronic signal at an output of said computer, in a form usable for operating a magnetic resonance apparatus.

2. A method as claimed in claim 1 comprising forming said function that is linear per segment from a first function segment that increases linearly up to a defined point in time, and a second function segment that decreases linearly from said defined point in time.

3. A method as claimed in claim 2 comprising setting said defined point in time to correspond to a middle of said time interval.

4. A method as claimed in claim 2 comprising setting said defined point in time to cause said increase of said gradient curve up to said defined point in time to be equal to a negative slope of said gradient curve at said defined point in time.

5. A method as claimed in claim 1 comprising determining, in said computer, whether the optimized gradient curve in said time interval complies with specification parameters of said magnetic resonance apparatus.

6. A method as claimed in claim 5 comprising using at least one of a maximum allowable gradient amplitude and a maximum allowable slew rate as said specification parameters.

7. A method as claimed in claim 5 comprising forming said function that is linear per segment from a first function segment that increases linearly up to a first defined point in time and a second function segment that decreases linearly as of said first defined point in time and wherein, if said gradient curve in said time interval exceeds a maximum allowable gradient amplitude of said magnetic resonance apparatus, forming a second function that is linear per segment from a first function segment that increases linearly up to said first point in time and a third function segment that decreases linearly as of a defined second point in time, and a second function segment that linearly connects said first and second defined points in time, with said third function segment being formed to give said gradient curve a constant value between said first and second defined points in time.

8. A method as claimed in claim 1 wherein said pulse sequence is provided to said computer and comprising, in said computer:
    automatically analyzing said pulse sequence to identify time intervals therein that must be left unmodified and time intervals therein that may be modified; and
    optimizing said gradient curve in at least one of said time intervals that may be modified.

9. A method as claimed in claim 8 comprising transmitting said pulse sequence to said computer as a plurality of successive event blocks and, upon arrival of each said event blocks at said computer, analyzing the arriving event block to identify time intervals therein that must not be modified and time intervals therein that may be modified, and, in said computer, defining a new division of said pulse sequence into outgoing event blocks dependent on the individual analysis of said arriving event blocks.

10. A method as claimed in claim 8 comprising identifying a time interval within said pulse sequence as a time interval that must be modified if, within said pulse sequence, any event takes place therein that is selected from the group consisting of emission of a radio-frequency pulse, readout of raw data, activation of a flux compensation gradient pulse, activation of a diffusion gradient pulse, and activation of a knock gradient pulse.

11. A method as claimed in claim 8 comprising identifying a time interval as a time interval that may be modified by an analysis selected from the group consisting of analysis of radio-frequency pulse transmission times, analysis of readout times, analysis of respective shapes of said gradient pulses, and analysis of designators included in a respective parameter set for a respective event block.

12. A method as claimed in claim 8 comprising initially determining an optimization time for optimizing said gradient curve in a time interval that can be modified and, dependent on said optimization time, determining, in said computer, whether to optimize said gradient curve in said modifiable time interval dependent on at least one boundary condition selected from said group, or whether to optimize said gradient curve by a spline interpolation technique.

13. A method as claimed in claim 1 comprising determining, in said computer, whether the optimized gradient curve in said time interval complies with specification parameters of said magnetic resonance apparatus and, if said optimized gradient curve does not comply with said specification parameters, replacing the optimized gradient curve in said time interval with a gradient curve in the pulse sequence originally provided to, or generated in, said computer.

14. A method for operating a magnetic resonance apparatus, comprising:
    providing to, or generating in, a computer, a pulse sequence comprising a plurality of radio-frequency pulses and a plurality of gradient pulses that are to be chronologically coordinated with the radio-frequency pulses, said gradient pulses exhibiting a gradient curve;
    in said computer, automatically determining a time interval associated with said gradient curve and optimizing said gradient curve dependent on boundary conditions for said gradient curve selected from the group consisting of:
        (a) a length of said time interval,
        (b) a target integral of said gradient curve over said time interval,
        (c) a start value of said gradient curve at a beginning of said time interval, and
        (d) an end value of said gradient curve at an end of said time interval;
    optimizing said gradient curve by defining said gradient curve according to a function that is linear per segment by addition of a first linear function that connects said start value and said end value of said gradient curve, and a second function that is linear per segment that assumes a function value of zero at the beginning and the end of said time interval, and which is defined to cause a sum of said integral of said first linear function and the integral of the second liner function that is linear per segment to correspond to the target integral; and
    emitting the pulse sequence with the optimized gradient curve therein as an electronic signal at an output of said computer, and operating a magnetic resonance apparatus according to the pulse sequence with the optimized gradient curve.

15. A pulse optimization device for optimizing a pulse sequence for a magnetic resonance system, comprising:
    a computer comprising an input interface and output interface;
    generate, a computer, a pulse sequence comprising a plurality of radio-frequency pulses and a plurality of gradient pulses that are to be chronologically coordinated with the radio-frequency pulses, said gradient pulses exhibiting a gradient curve;
    said input interface being configured to receive, or said computer being configured to said computer being configured to automatically determine a time interval associated with said gradient curve and to optimize said gradient curve dependent on boundary conditions for said gradient curve selected from the group consisting of:

(a) a length of said time interval, (b) a target integral of said gradient curve over said time interval, (c) a start value of said gradient curve at a beginning of said time interval, and (d) an end value of said gradient curve at an end of said time interval;

said computer being configured to optimize said gradient curve by defining said gradient curve according to a function that is linear per segment by addition of a first linear function that connects said start value and said end value of said gradient curve, and a second function that is linear per segment that assumes a function value of zero at the beginning and the end of said time interval, and which is defined to cause a sum of said integral of said first linear function and the integral of the second liner function that is linear per segment to correspond to the target integral; and said computer being configured to emit, via said output interface, the pulse sequence with the optimized gradient curve therein as an electronic signal at an output of said computer, in a form usable for operating a magnetic resonance apparatus.

16. A magnetic resonance apparatus comprising:

a radio-frequency transmission system;

a gradient system;

a control device configured to operate the radio-frequency transmission system and the gradient system according to a pulse sequence;

a pulse sequence optimization device that provides said pulse sequence to said control unit;

said pulse sequence optimization device comprising a computer configured to receive or generate a pulse sequence comprising a plurality of radio-frequency pulses and a plurality of gradient pulses that are to be chronologically coordinated with the radio-frequency pulses, said gradient pulses exhibiting a gradient curve;

said computer being configured to automatically determine a time interval associated with said gradient curve and to optimize said gradient curve dependent on boundary conditions for said gradient curve selected from the group consisting of:

(a) a length of said time interval, (b) a target integral of said gradient curve over said time interval, (c) a start value of said gradient curve at a beginning of said time interval, and (d) an end value of said gradient curve at an end of said time interval;

said computer being configured to optimize said gradient curve by defining said gradient curve according to a function that is linear per segment by addition of a first linear function that connects said start value and said end value of said gradient curve, and a second function that is linear per segment that assumes a function value of zero at the beginning and the end of said time interval, and which is defined to cause a sum of said integral of said first linear function and the integral of the second liner function that is linear per segment to correspond to the target integral;

said computer being configured to emit the pulse sequence with the optimized gradient curve therein as an electronic signal at an output of said computer to said control unit; and said control unit being configured to operate said radio-frequency transmission system and said gradient system according to said pulse sequence with said optimized gradient curve therein.

17. A non-transitory, computer-readable data storage medium encoded with programming instructions, said storage medium being loaded into a computer and said programming instructions causing said computer to:

receive or generate a pulse sequence comprising a plurality of radio-frequency pulses and a plurality of gradient pulses that are to be chronologically coordinated with the radio-frequency pulses, said gradient pulses exhibiting a gradient curve;

automatically determine a time interval associated with said gradient curve and optimize said gradient curve dependent on boundary conditions for said gradient curve selected from the group consisting of:

(a) a length of said time interval, (b) a target integral of said gradient curve over said time interval, (c) a start value of said gradient curve at a beginning of said time interval, and (d) an end value of said gradient curve at an end of said time interval;

optimize said gradient curve by defining said gradient curve according to a function that is linear per segment by addition of a first linear function that connects said start value and said end value of said gradient curve, and a second function that is linear per segment that assumes a function value of zero at the beginning and the end of said time interval, and which is defined to cause a sum of said integral of said first linear function and the integral of the second liner function that is linear per segment to correspond to the target integral; and emit the pulse sequence with the optimized gradient curve therein as an electronic signal at an output of said computer, in a form usable for operating a magnetic resonance apparatus.

\* \* \* \* \*